(12) United States Patent
Cerini et al.

(10) Patent No.: US 11,418,888 B2
(45) Date of Patent: Aug. 16, 2022

(54) MICROELECTROMECHANICAL ELECTROACOUSTIC TRANSDUCER WITH PIEZOELECTRIC ACTUATION AND CORRESPONDING MANUFACTURING PROCESS

(71) Applicant: STMICROELECTRONICS S.r.l., Agrate Brianza (IT)

(72) Inventors: Fabrizio Cerini, Magenta (IT); Enri Duqi, Milan (IT); Silvia Adorno, Novate Milanese (IT); Lorenzo Baldo, Bareggio (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 241 days.

(21) Appl. No.: 16/749,579

(22) Filed: Jan. 22, 2020

(65) Prior Publication Data
US 2020/0236470 A1    Jul. 23, 2020

(30) Foreign Application Priority Data

Jan. 23, 2019  (IT) .......................... 102019000001017

(51) Int. Cl.
*H04R 19/00* (2006.01)
*H04R 19/02* (2006.01)
(Continued)

(52) U.S. Cl.
CPC ............ *H04R 19/02* (2013.01); *B81B 3/0051* (2013.01); *B81C 1/0015* (2013.01); *H04R 1/025* (2013.01);
(Continued)

(58) Field of Classification Search
CPC ........ H04R 19/02; H04R 1/025; H04R 17/00; H04R 19/005; H04R 31/006;
(Continued)

(56) References Cited

U.S. PATENT DOCUMENTS

2003/0206490 A1* 11/2003 Butler .................... G10K 9/121
                                                    367/163
2015/0071467 A1*  3/2015 Kaplan ............... H01L 41/0805
                                                    381/190
(Continued)

FOREIGN PATENT DOCUMENTS

JP          2008-30182 A      2/2008

*Primary Examiner* — Matthew A Eason
(74) *Attorney, Agent, or Firm* — Seed IP Law Group LLP

(57) ABSTRACT

An actuation structure of a MEMS electroacoustic transducer is formed in a die of semiconductor material having a monolithic body with a front surface and a rear surface extending in a horizontal plane x-y plane and defined in which are: a frame; an actuator element arranged in a central opening defined by the frame; cantilever elements, coupled at the front surface between the actuator element and the frame; and piezoelectric regions arranged on the cantilever elements and configured to be biased to cause a deformation of the cantilever elements by the piezoelectric effect. A first stopper arrangement is integrated in the die and configured to interact with the cantilever elements to limit a movement thereof in a first direction of a vertical axis orthogonal to the horizontal plane, x-y plane towards the underlying central opening.

14 Claims, 9 Drawing Sheets

(51) Int. Cl.
*B81B 3/00* (2006.01)
*B81C 1/00* (2006.01)
*H04R 1/02* (2006.01)
*H04R 17/00* (2006.01)
*H04R 31/00* (2006.01)

(52) U.S. Cl.
CPC ............ *H04R 17/00* (2013.01); *H04R 19/005* (2013.01); *H04R 31/006* (2013.01); *B81B 2201/0257* (2013.01); *B81B 2203/0118* (2013.01); *B81B 2203/0127* (2013.01); *B81B 2203/0315* (2013.01); *B81C 2201/0116* (2013.01); *B81C 2201/0133* (2013.01); *B81C 2201/0178* (2013.01); *H04R 2201/003* (2013.01); *H04R 2400/11* (2013.01)

(58) Field of Classification Search
CPC .......... H04R 2201/003; H04R 2400/11; B81B 3/0051; B81B 2201/0257; B81B 2203/0118; B81B 2203/0127; B81B 2203/0315; B81C 1/0015; B81C 2201/0116; B81C 2201/0133; B81C 2201/0178

See application file for complete search history.

(56) References Cited

U.S. PATENT DOCUMENTS

| | | | |
|---|---|---|---|
| 2017/0085994 A1* | 3/2017 | Clerici | H04R 17/005 |
| 2017/0325030 A1* | 11/2017 | Stoppel | H04R 17/00 |
| 2018/0152792 A1* | 5/2018 | Hoekstra | H04R 29/004 |
| 2018/0262845 A1* | 9/2018 | Shi | B81B 3/007 |
| 2018/0279053 A1* | 9/2018 | Clerici Beltrami | B81B 3/0021 |
| 2020/0177996 A1* | 6/2020 | Chen | H04R 7/16 |
| 2020/0236470 A1* | 7/2020 | Cerini | B81C 1/0015 |

* cited by examiner

MICROELECTROMECHANICAL ELECTROACOUSTIC TRANSDUCER WITH PIEZOELECTRIC ACTUATION AND CORRESPONDING MANUFACTURING PROCESS

BACKGROUND

Technical Field

The present solution relates to a microelectromechanical electroacoustic transducer with piezoelectric actuation (made with MEMS, Micro-Electro-Mechanical Systems, technology) and to a corresponding manufacturing process; in particular, hereinafter reference will be made, without thereby this implying any loss of generality, to a MEMS transducer operating as actuator for the generation of sound waves, i.e., to a MEMS speaker.

Description of the Related Art

In a known way, electromagnetically actuated speakers are currently the most widely used, for example for headphones, earpieces, and diffusers for portable devices (such as smartphones, tablets or the like). In particular, transducers of the so-called BA (Balanced Armature Driver) type, based on the principle of electromagnetic actuation, envisage use of an electrical signal to set in vibration a thin lamina arranged between two magnetic windings. The movement of this lamina is transferred to a diaphragm, generally made of aluminum, for the generation of acoustic signals in the audio band.

Recently, the use of acoustic transducers, in particular speakers, made with MEMS technology has been proposed, whose operation is based on the reverse piezoelectric principle (i.e., on a mechanical deformation resulting from an applied electric voltage).

In general, such piezoelectric MEMS transducers, with respect to traditional electromagnetically actuated transducers, can offer considerable advantages, which are particularly relevant for use in portable electronic devices, amongst which: an increase in the precision of mechanical actuation; a better fidelity in audio reproduction; and reduced cost, weight, and size.

BRIEF SUMMARY

The present solution provides a microelectromechanical electroacoustic transducer with piezoelectric actuation.

The present solution provides a transducer and a corresponding manufacturing process, as defined in the annexed claims.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

It is observed that transducers of the BA type do not have a flat frequency response in the audio band and suffer from relevant resonance effects; instead, piezoelectric MEMS transducers may in general have a flatter frequency response and a faster dynamic response.

Moreover, piezoelectric MEMS transducers can guarantee preservation of the acoustic integrity even after being completely immersed in a liquid or a powder medium.

However, it is observed that, in general, piezoelectric MEMS transducers have a lower mechanical strength, being more subject to damages in the case of dropping or impact (an event that is, on the other hand, rather frequent in the case of use in portable devices).

The inventors recognized that it is hence important to design piezoelectric MEMS transducers so as to reduce the possibility of damages in the case of dropping or impact and so as to increase their mechanical strength.

Figure 1:
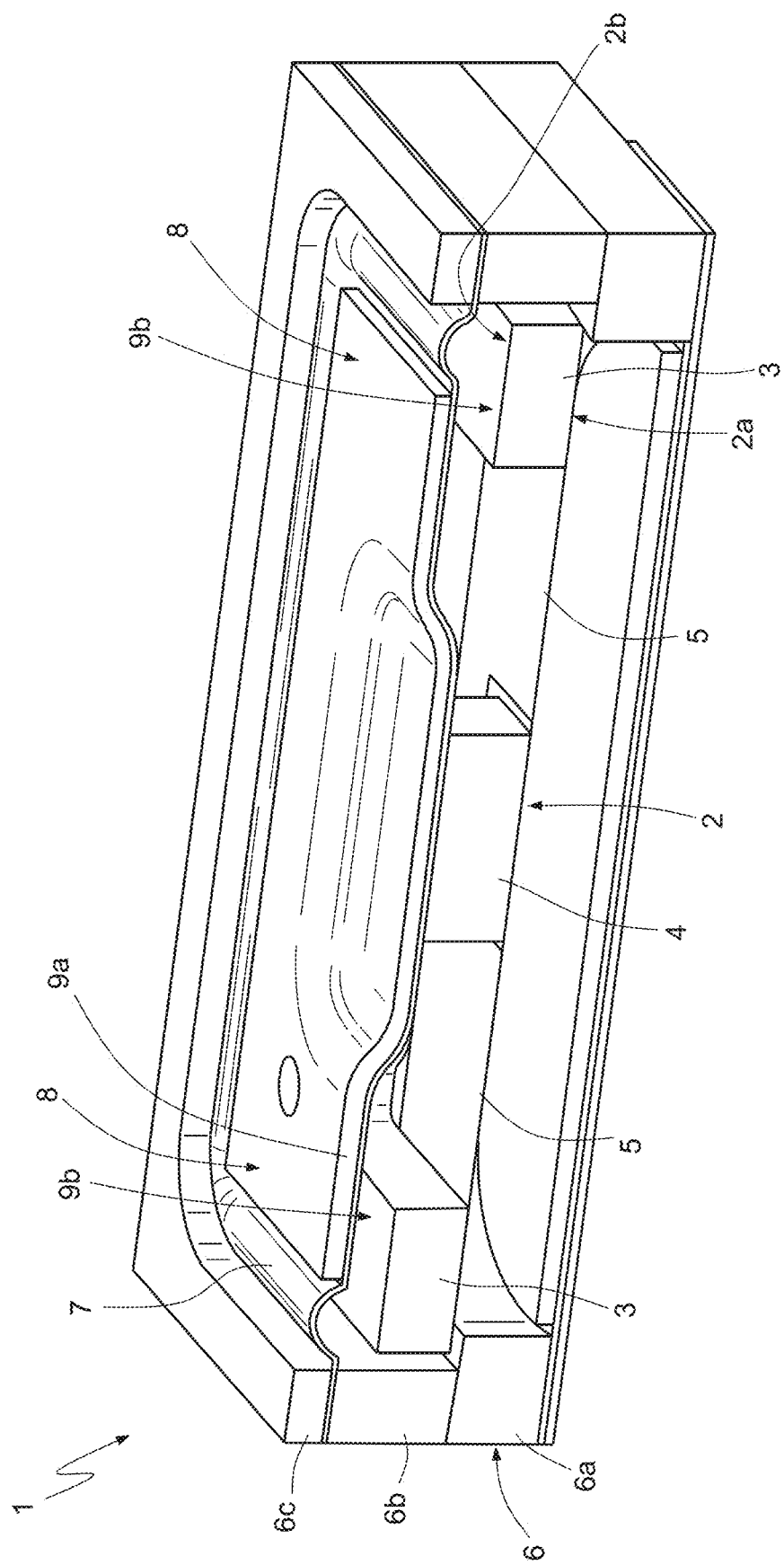
FIG. 1 is a perspective cross-section view of a MEMS electroacoustic transducer of a known type.

As illustrated in FIG. 1, this piezoelectric MEMS transducer, designated as a whole by 1, comprises a die 2 of semiconductor material, including a supporting substrate 3, which is frame-shaped and surrounds a coupling element 4 (formed in the same die 2). An actuation structure 5, including a layer of piezoelectric material superimposed on a layer of epitaxial polysilicon, connects the coupling element 4 to the supporting substrate 3, at a first surface 2a of the die 2.

The piezoelectric MEMS transducer 1 further comprises a housing structure 6, having: a bottom part 6a, which is coupled to the first surface 2a of the die 2, underneath the actuation structure 5, and defines a cavity, above which the same actuation structure 5 is suspended; a central part 6b, laterally coupled to the die 2; and a top part 6c, coupled above a second surface 2b of the die 2, opposite in a vertical direction to the first surface 2a.

In particular, the aforesaid top part 6c of the housing structure 6 carries an acoustic membrane 7, having a funnel-shape and centrally coupled to the coupling element 4.

The piezoelectric MEMS transducer 1 further comprises a stopper mechanism 8, constituted by: a reinforcement element 9a, coupled (in particular glued) to the acoustic membrane 7 and having the same funnel shape; and a stopper element 9b, constituted by the surface of the same supporting substrate 3 at the second surface 2b of the die 2, which is facing the aforesaid reinforcement element 9a normally at a certain separation distance, in the resting position of the acoustic membrane 7.

During operation, application of an appropriate biasing signal to the piezoelectric layer of the actuation structure 5 causes deflection (upwards or downwards with respect to a vertical axis) of the same actuation structure 5 and consequently of the coupling element 4, which causes the corresponding deflection of the acoustic membrane 7, aimed at emission of sound waves in the audio band.

In particular, the stopper mechanism 8 acts so as to limit the maximum deflection of the acoustic membrane 7 in a vertical direction, only towards the bottom part 6a of the housing structure 6, so as to reduce, in part, the possibility of breaking of the acoustic membrane 7 in the case of impact or dropping.

The present Applicant has further realized that the piezoelectric MEMS transducer 1 has some limitations that do not enable complete exploitation of its advantageous characteristics.

In particular, the stopper mechanism 8 safeguards the acoustic membrane 7 from breaking as a result of movements that occur only in one direction of the aforesaid vertical axis, and the piezoelectric MEMS transducer 1 does not have any stopper arrangement for safeguarding the actuation structure 5 and the corresponding layer of piezoelectric material from failures; the same actuation structure 5, in the case of impact or dropping, may thus be damaged and jeopardies operation of the piezoelectric MEMS transducer 1.

The same stopper mechanism 8, although enabling, as discussed, limitation of damage to the acoustic membrane 7 (in just one direction of movement) causes the acoustic membrane 7 to have dimensions that have to be similar to those of the reinforcement element 9a.

In addition, since the reinforcement element 9a is coupled to the acoustic membrane 7 by gluing, manufacturing of the stopper mechanism 8 proves to be complex, entailing additional processing steps during coupling of the die 2 of semiconductor material, which has been previously processed, to the corresponding housing structure 6.

Figure 2:
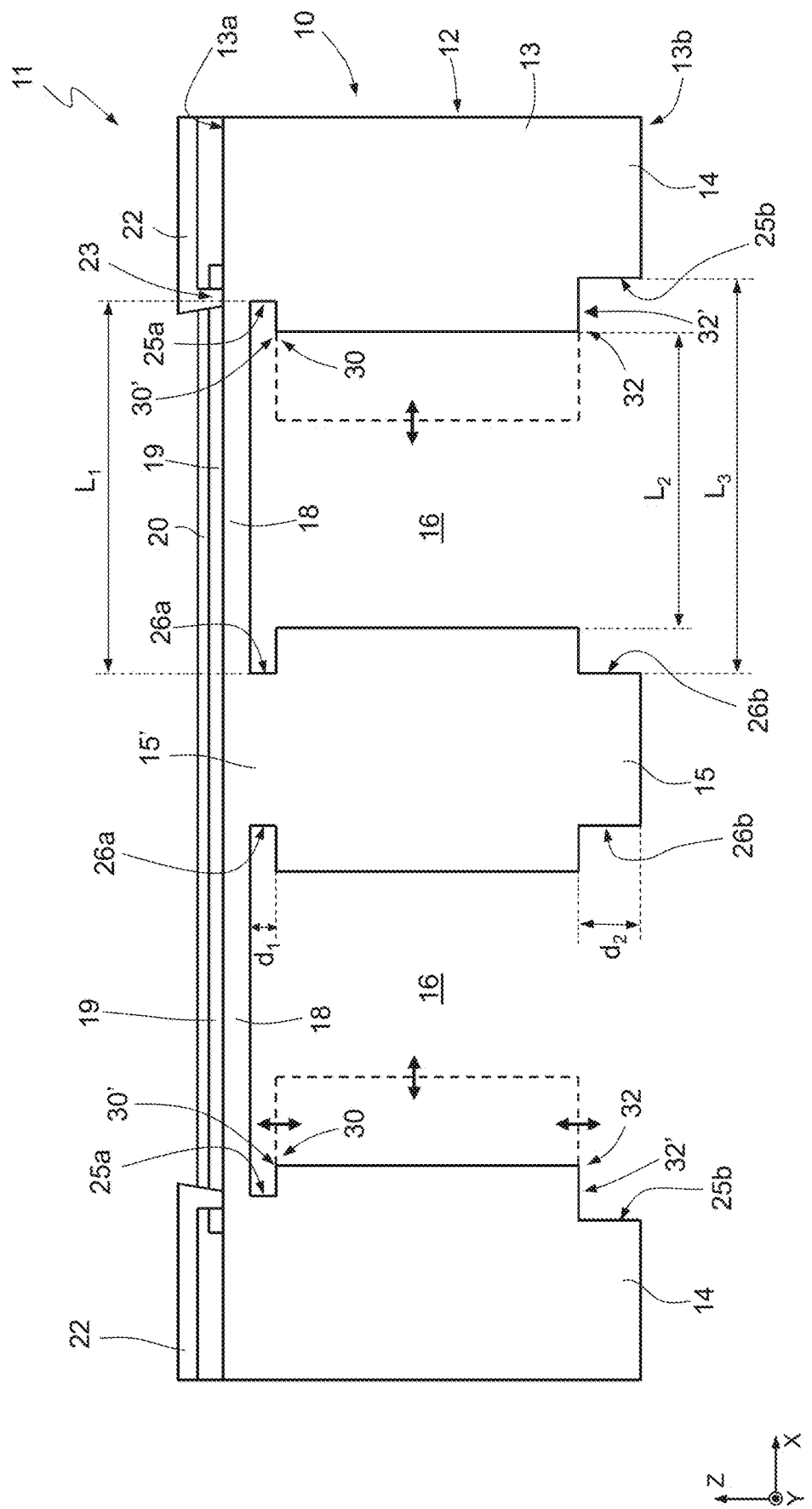
FIG. 2 is a schematic cross-section view of a piezoelectric actuation structure of a MEMS electroacoustic transducer, according to some embodiments of the present solution.

With reference to FIG. 2, an actuation structure 10 of a MEMS electroacoustic transducer 11 (which will be illustrated in greater detail hereinafter), according to some embodiments of the present solution, is now disclosed.

The actuation structure 10 is made in a die 12, comprising a monolithic body 13 of semiconductor material, in particular monocrystalline silicon, having a front surface 13a and a rear surface 13b.

The actuation structure 10 comprises, in the same monolithic body 13, a frame 14 and an actuator element 15. The frame 14 surrounds the actuator element 15 and is separated from the actuator element 15 by a central opening 16; the actuator element 15 is arranged in a central position with respect to the central opening 16 and is pillar-shaped.

The actuation structure 10 further comprises, also provided in the same monolithic body 13, in a surface portion (at the front surface 13a), cantilever elements 18, which are suspended above the central opening 16 and extend between the frame 14 and the actuator element 15. Each cantilever element 18 has a first end coupled to the frame 14 and a second end coupled to the actuator element 15, at a coupling portion 15' thereof.

In some embodiments, as will also be discussed hereinafter, advantageously, the cantilever elements 18 and the actuator element 15 are coupled through elastic coupling elements 17 (illustrated schematically in FIG. 3).

The actuation structure 10 further comprises: piezoelectric regions 19, arranged on the cantilever elements 18, formed by one or more overlying layers including piezoelectric material (in a known way, here not described in detail); and a passivation layer 20, made of dielectric material, arranged on the piezoelectric regions 19. In the embodiment illustrated, the layers of piezoelectric material extend also over the actuator element 15.

Electrical-connection paths 22 are arranged over the passivation layer 20 and cross the same passivation layer 20 inside contact openings 23, to achieve the electrical connection with the piezoelectric regions 19 and enable biasing thereof by means of appropriate electrical signals.

The central opening 16 extends vertically (along a vertical axis z orthogonal to a horizontal plane x-y plane in which the aforesaid front and rear surfaces 13a, 13b of the monolithic body 13 lie) starting from the rear surface 13b of the monolithic body 13 up to the cantilever elements 18, which are arranged at the front surface 13a of the same monolithic body 13.

As shown in the aforesaid FIG. 2, the central opening 16 has: a first width L1 (in the direction of longitudinal extension of the cantilever elements 18 in the horizontal plane x-y plane, along a first horizontal axis x) at the front surface 13a of the monolithic body 13, directly underneath the cantilever elements 18; a second width L2 through the thickness of the monolithic body 13; and a third width L3 at the rear surface 13b of the monolithic body 13. In particular, the first width L1 is greater than the second width L2, and the third width L3 is greater than the second width L2 (possibly, the third width L3 being equal to the first width L1).

Consequently, first recesses 25a are defined along a vertical wall of the frame 14, facing the central opening 16, in a position vertically corresponding to the coupling portions with the cantilever elements 18 and in the proximity of the front surface 13a of the monolithic body 13; likewise, second recesses 25b are defined along the same vertical wall of the frame 14, at the rear surface 13b of the monolithic body 13.

In a corresponding manner, defined along the vertical walls of the actuator element 15 facing the central opening 16 are: respective first recesses 26a (obtained in the corresponding coupling portion 15') at the front surface 13a of the monolithic body 13; and respective second recesses 26b at the rear surface 13b of the monolithic body 13. According to an aspect of the present solution, the actuation structure 10 comprises a first stopper arrangement 30, made integrally to the die 12 and the monolithic body 13, configured to stop movement along a first direction of the vertical axis z, in particular to stop movement of the cantilever elements 18 towards the underlying central opening 16.

The first stopper arrangement 30 is defined by the first recesses 25a of the frame 14, which determine a first stopper surface 30' facing the cantilever elements 18, arranged at a certain distance d1 (in the vertical direction) from the cantilever elements 18, in the resting condition, i.e., in the absence of any deformation, of the cantilever elements 18 (the distance d1 moreover corresponding to the distance between the stopper surface 30' and the front surface 13a of the monolithic body 13).

It should be noted that the extension of the facing surface, as well as the facing distance, are univocally defined by the conformation of the aforesaid first recesses 25a of the frame 14.

Also the respective first recesses 26a of the actuator element 15 can contribute to defining a further stopper arrangement 30, thus contributing to stopping movement of the cantilever elements 18 along the vertical direction, at the same actuator element 15.

The actuation structure 10 further comprises a second stopper arrangement 32, which is also made integrally to the die 12 and the monolithic body 13, configured to limit movement of the cantilever elements 18 along a second direction of the vertical axis z (opposite to the first direction), and, as will be highlighted hereinafter, movement in the second direction of an acoustic membrane that is designed to be coupled to the actuator element 15 at the rear surface 13b of the monolithic body 13.

The aforesaid second stopper arrangement 30 is defined by the second recesses 25b of the frame 14, which define a second stopper surface 32', which is designed to face a stopper element coupled to the aforesaid acoustic membrane, arranged at a certain distance d2 (in the vertical direction) with respect to the stopper element, in the resting condition, i.e., in the absence of deformations (the distance d2 moreover corresponding to the distance between the second stopper surface 32' and the rear surface 13b of the monolithic body 13).

It should be noted that the extension of the facing surface, as well as the facing distance, are univocally defined also in this case by the conformation of the aforesaid second recesses 25b of the frame 14.

The respective second recesses 26b of the actuator element 15 contribute, as on the other hand will be clear hereinafter, to limit adhesion of the actuator element 15 to an adhesive tape during the manufacturing steps, with the aim of reducing possible mechanical failures of the cantilever elements 18 during detachment of the frame 14 from the tape in the assembly steps.

The first and the second stopper arrangements 30, 32 thus jointly define a bi-directional stopper mechanism along the vertical axis z, for limiting and stopping the movements of the actuation structure 10, thus effectively reducing the possibility of breaking in case of impact or dropping.

Figure 3:
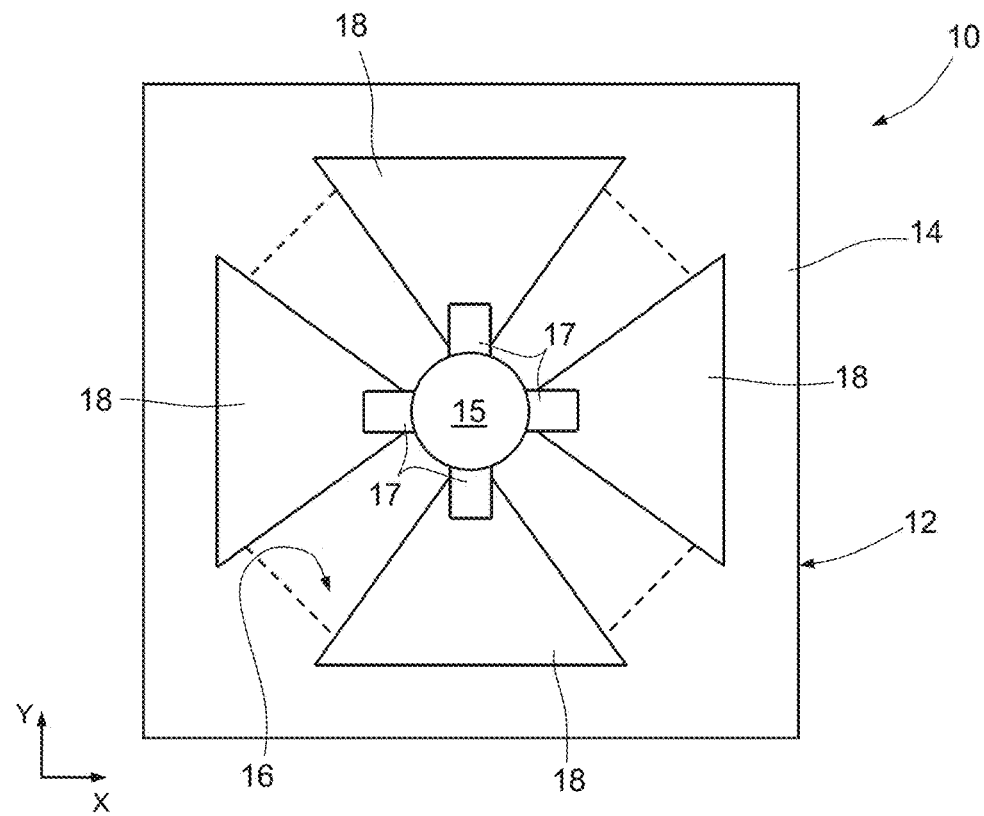
FIG. 3 is a schematic top plan view of the piezoelectric actuation structure of FIG. 2.

As illustrated schematically in FIG. 3, in a possible embodiment (represented by way of example, and not to be considered limitative), the aforesaid central opening 16 has a generically circular shape in plan view and the cantilever elements 18, four in number in the example represented, have a generically triangular shape in plan view and are arranged, in pairs, on opposite sides of the actuator element 15, along diametral directions. In a way not illustrated in detail, the elastic coupling elements 17 that couple each cantilever element 18 to the coupling portion 15' of the actuator element 15 may have a configuration of a folded type.

Figure 4:
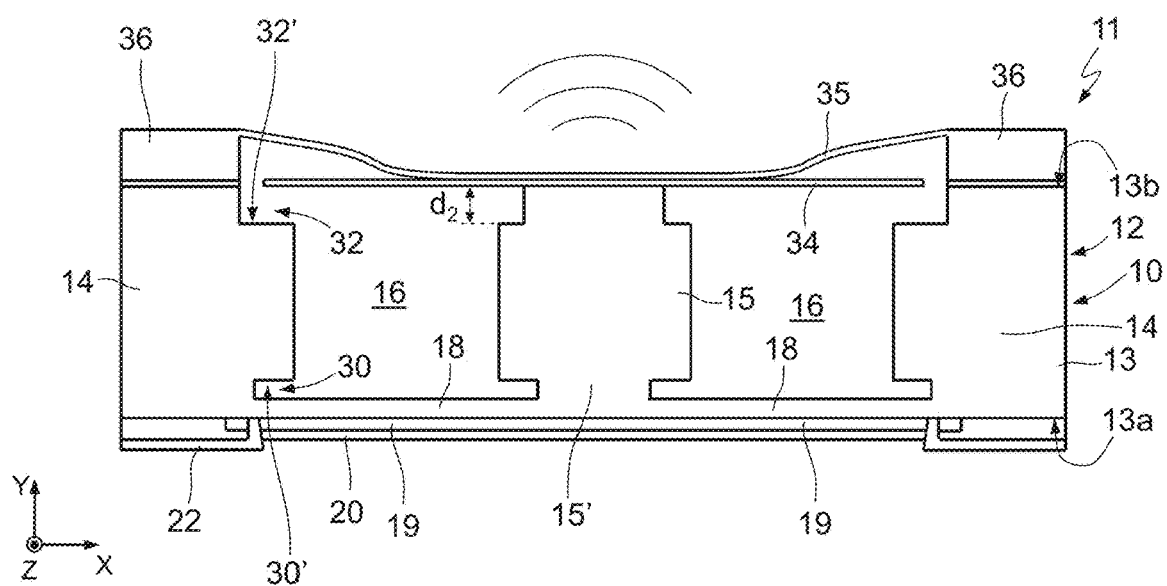
FIG. 4 is a schematic cross-section view of a first embodiment of a MEMS electroacoustic transducer, comprising the piezoelectric actuation structure of FIG. 2.

FIG. 4 shows, in an assembled condition, a first embodiment of the MEMS electroacoustic transducer 11, which comprises the actuation structure 10 and moreover a rigid lamina 34, coupled to the actuator element 15, on the rear surface 13b of the monolithic body 13.

The rigid lamina 34 has a side extension (parallel to the extension of the cantilever elements 18 along the axis x) greater than the extension of the central opening 16, so as to have end portions facing the second stopper surface 32' of the second stopper arrangement 32, at the distance d2 from the second stopper surface 32' in the resting condition.

The MEMS electroacoustic transducer 11 further comprises a thin acoustic membrane 35, centrally coupled (for example, glued) to the rigid lamina 34 only at a corresponding central portion and supported at respective ends by supporting elements 36, coupled (for example, glued) on the rear surface 13b of the monolithic body 13 around the frame 14.

The acoustic membrane 35 has a concave funnel shape and undergoes deformation, during operation, following movement of the actuator element 15 due to deformation by the reverse piezoelectric effect of the piezoelectric regions 19, thus generating sound waves in the audio band (the actuator element 15 hence acting as a piston actuator along the vertical axis z).

In particular, the first stopper arrangement 30 enables stopping movement of the cantilever elements 18 and of the acoustic membrane 35 in a first direction of the vertical axis z (in the representation of FIG. 4, upwards). In particular, the end portions of the stopper elements 18 abut against the facing surface (first stopper surface 30') of the first stopper arrangement 30, thus stopping their movement.

The second stopper arrangement 32 enables stopping movement of the acoustic membrane 35 and of the cantilever elements 18 in the second direction of the vertical axis z (in the representation of FIG. 4, downwards). In particular, the rigid lamina 34 constitutes a stopper element that abuts against the facing surface (second stopper surface 32') of the second stopper arrangement 32, thus stopping the movement.

Figure 5:
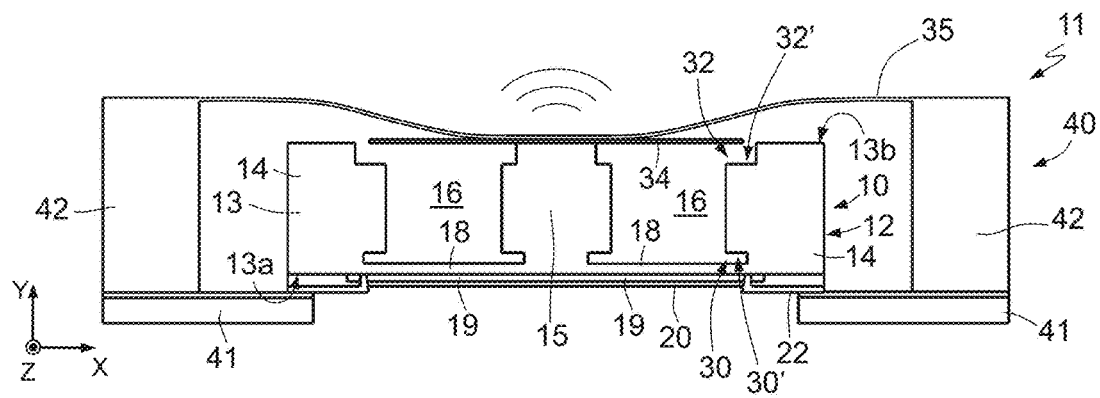
FIG. 5 is a schematic cross-section view of a second embodiment of a MEMS electroacoustic transducer, comprising the piezoelectric actuation structure of FIG. 2.

FIG. 5 shows a different embodiment of the MEMS electroacoustic transducer, once again designated by 11, which comprises in this case a housing structure 40 external to the actuation structure 10, having a frame shape surrounding the actuation structure 10.

In particular, the housing structure 40 comprises: a base 41 to which the actuation structure 10 is coupled, above the front surface 13a of the monolithic body 13; and a supporting portion 42, which surrounds the actuation structure 10 and has a first surface coupled to the base 41 and a second surface, vertically opposite to the first surface, to which end portions of the acoustic membrane 35 are coupled.

Also in this embodiment, as previously discussed, with appropriate electrical biasing signals being applied to the piezoelectric regions 19, the actuator element 15 is displaced and the acoustic membrane 35 is deformed, which generates sound waves in the audio band.

Also in this case, the first stopper arrangement 30 enables stopping the movement of the cantilever elements 18 and of the acoustic membrane 35 in the first direction of the vertical axis z (in the representation of FIG. 5, upwards), and the second stopper arrangement 32 enables stopping the movement of the acoustic membrane 35 and of the cantilever elements 18 in the second direction of the vertical axis z (in the representation of FIG. 5, downwards).

This embodiment has the advantage, at the expense of a greater encumbrance, of enabling a greater extension of the acoustic membrane 35 and, consequently, of reaching higher sound-pressure-level values, given the same displacement of the actuator element 15.

Figure 6A:
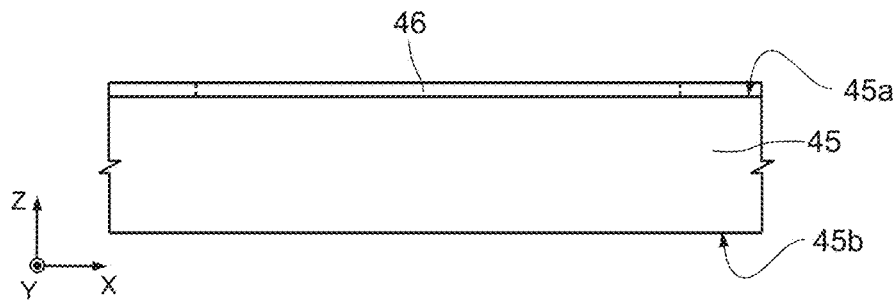
FIGS. 6A-6L are schematic cross-section views of the piezoelectric actuation structure of FIG. 2, in subsequent steps of a corresponding manufacturing process.

With initial reference to FIG. 6A, a possible process for manufacturing the actuation structure 10 of the MEMS electroacoustic transducer 11 is now discussed.

In an initial step of the manufacturing process, a wafer 45 of semiconductor material, in particular monocrystalline silicon, is provided, having a front surface 45a and a rear surface 45b.

The manufacturing process then envisages formation of a buried cavity completely contained inside the wafer 45, overlaid by a membrane, with techniques described in detail, for example, in EP 1 324 382 B1 filed in the name of the present Applicant.

Centrally with respect to the buried cavity an element of semiconductor material, in particular of monocrystalline silicon is concurrently defined, which is configured to form, as will be clarified hereinafter, the coupling portion 15' (see FIG. 6D) of the actuator element 15 of the actuation structure 10.

Figure 6B:
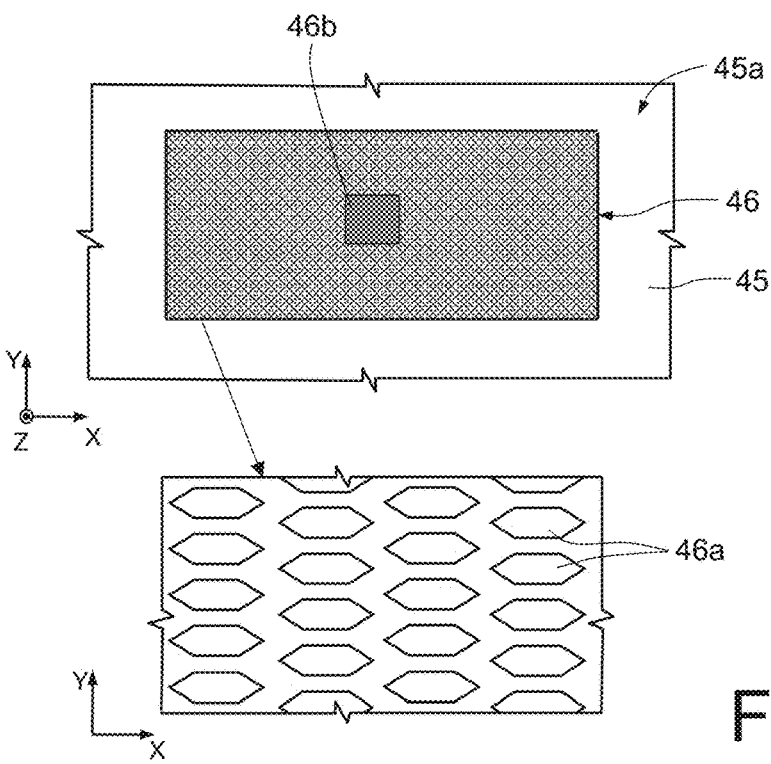

As illustrated also in FIG. 6B (not in scale), on the front surface 45a of the wafer 45 an etching mask 46 is firstly obtained, for example made of photosensitive material, the so-called photoresist. The etching mask defines an etching area, which in the example is approximately rectangular (but it may likewise be circular or generically polygonal), and comprises a plurality of first mask portions 46a, for example hexagonal, which define a lattice of openings, for example a honeycomb lattice. The etching area of the etching mask 46 corresponds to the area that will be occupied by the buried cavity and has an extension corresponding to the extension of the membrane that will be formed above the same buried cavity. At the center, the etching mask 46 has a second mask portion 46b, solid and without openings, where the aforesaid coupling portion 15' will be defined.

Figure 6C:
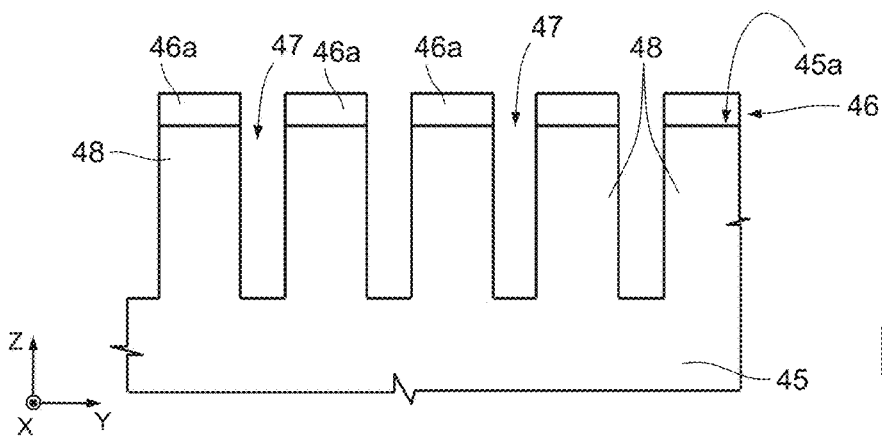

Then (see FIG. 6C, which, like FIG. 6B, shows only an enlarged portion of the wafer 45, for reasons of clarity of illustration), using the etching mask 45 an anisotropic chemical etch of the wafer 45 is carried out starting from the front surface 45a, following upon which trenches 47 are formed, which communicate with one another and delimit a plurality of silicon columns 48.

The trenches 47 form an open region having a complex shape (corresponding to the lattice of the etching mask 46) where the columns 48 (having a section corresponding to the first mask portions 46a) are arranged. At the center of the aforesaid open region a central portion of semiconductor material remains, corresponding to the aforesaid second mask portion 46b.

Next, the etching mask 46 is removed, and an epitaxial growth is carried out in a deoxidizing environment (typically, in an atmosphere with a high hydrogen concentration, preferably with trichlorosilane "SiHCl$_3$"). Consequently, an epitaxial layer grows above the columns 48 and closes the aforesaid open region formed by the trenches 47 at the top.

A step of thermal annealing is then carried out, for example for 30 minutes at 1190° C., preferably in a reducing atmosphere, typically a hydrogen atmosphere. The annealing step causes migration of silicon atoms, which tend to move into a position of lower energy. Consequently, and also thanks to the short distance between the columns 48, the silicon atoms completely migrate from the portions of the columns 48 inside the aforesaid open region formed by the trenches 47, and, starting from said region, a buried cavity 50 (as illustrated in FIG. 6D, which represents a more extensive portion of the wafer 45) is formed.

It should be noted that, inside the aforesaid buried cavity 50 the aforesaid central portion of semiconductor material remains, which defines the coupling portion 15' of the actuator element 15.

Figure 6D:
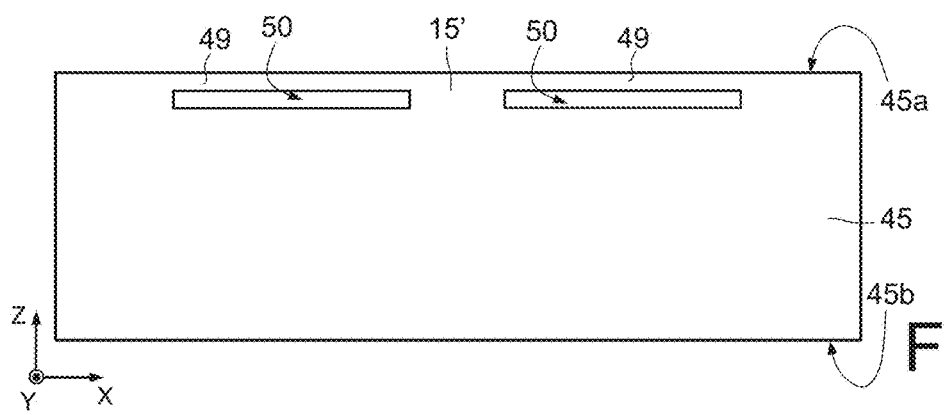

As illustrated once again in FIG. 6D, a thin layer of monocrystalline silicon remains above the buried cavity 50, constituted partly by silicon atoms grown epitaxially and partly by migrated silicon atoms and which forms the membrane, designated by 49. At the center, the membrane 49 is coupled to the coupling portion 15', arranged centrally with respect to the buried cavity 50.

Figure 6E:
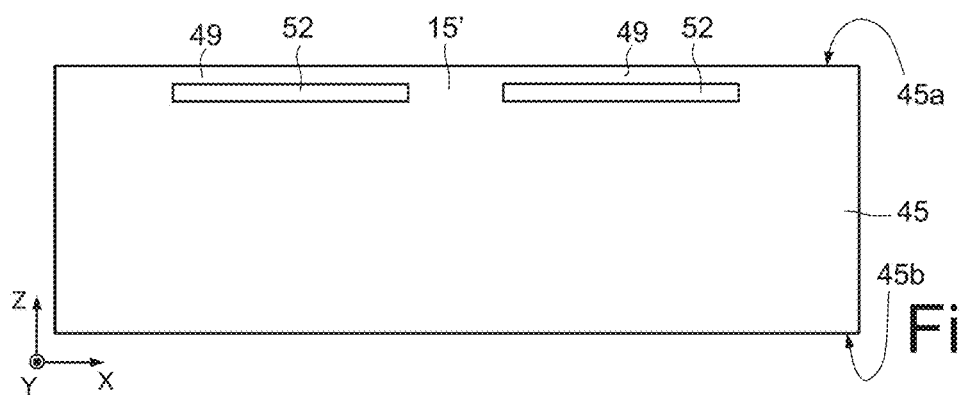

As illustrated in FIG. 6E, the manufacturing process then proceeds with oxidation (which may be complete, as in the example illustrated, or even only partial, with formation of an internal coating layer) of the buried cavity 50 so as to form a buried-oxide region 52 underneath the membrane 49 and surrounding the aforesaid coupling portion 15'.

In a way not illustrated in detail, the above oxidation step envisages carrying out an etch starting from the top surface 45a of the wafer 45 through appropriate masking so as to form access trenches, which extend through the membrane 49 and reach the buried cavity 50. Next, a step of thermal oxidation of the internal walls of the buried cavity 50 is carried out, supplying oxygen through the access trenches; the oxide grows progressively starting from the walls up to complete closing of the access trenches and possibly of the buried cavity 50 (or, alternatively, with formation of the coating layer inside the buried cavity 50).

Figure 6F:
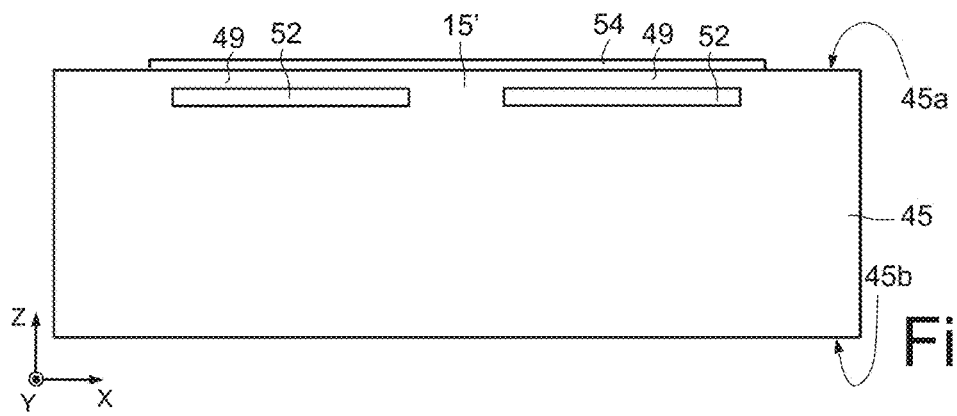

As illustrated in FIG. 6F, the manufacturing process then proceeds with formation, on the front surface 45a of the wafer 45, at the top of the membrane 49, of a piezoelectric actuation structure 54, including piezoelectric material.

In a way not shown in detail, the piezoelectric actuation structure 54 may be formed by a stack of layers superimposed on one another, for example made by the superposition of a bottom dielectric layer, of a first electrode layer, of a piezoelectric layer, of a second electrode layer, and of a top dielectric layer.

Figure 6G:
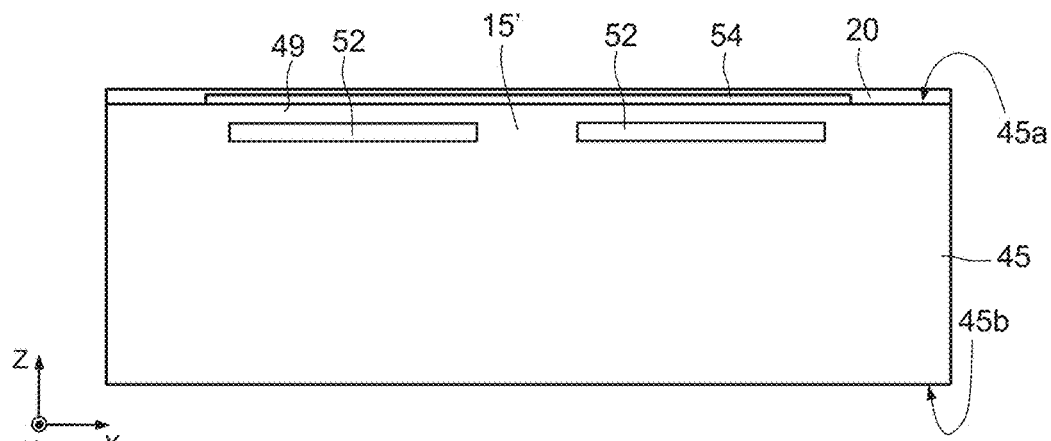

Next (FIG. 6G), a passivation layer is formed on the piezoelectric actuation structure 54 (once again designated by 20, as in the case discussed previously with regard to FIG. 2).

Figure 6H:
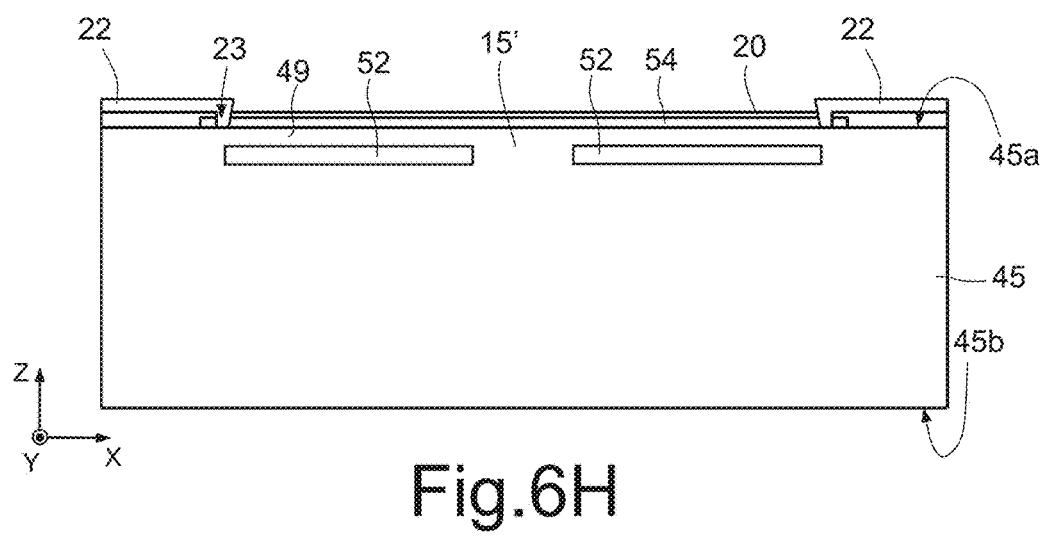

The passivation layer 20 and the underlying piezoelectric actuation structure 54 are then etched by means of an appropriate masking so as to form the contact openings 23 towards the piezoelectric actuation structure 54. Next, these contact openings are filled by conductive material in a step of formation of electrical-connection paths 22 on the passivation layer 20, as illustrated in FIG. 6H.

Figure 6I:
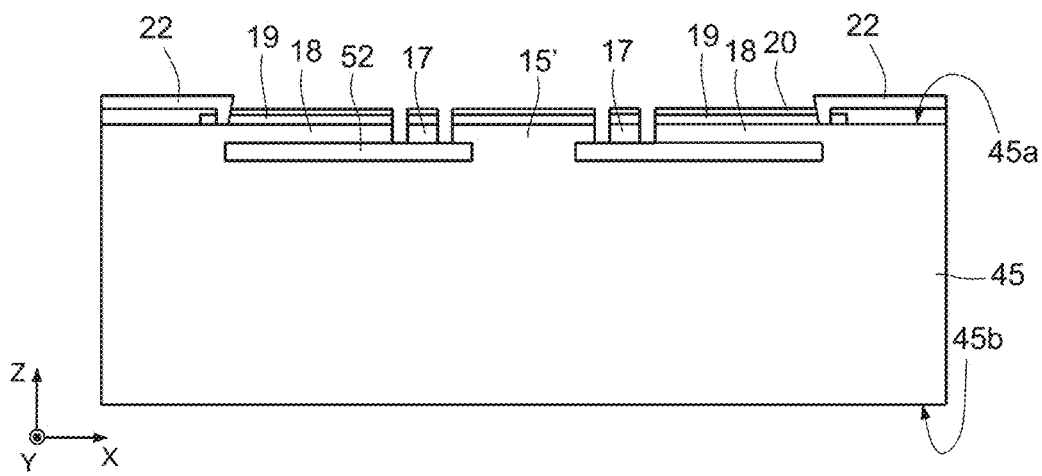

Next, as illustrated schematically in FIG. 6I, the piezoelectric actuation structure 54 and the underlying membrane 49 are subjected to etching by means of an appropriate masking, for definition of the geometry of the cantilever elements 18 and of the overlying piezoelectric regions 19 of the actuation structure 10. In the same etching step, the elastic coupling elements 17 may be formed (which are illustrated schematically only in the aforesaid FIG. 6L), which connect the cantilever elements 18 to the coupling portion 15' of the actuator element 15 of the actuation structure 10.

Figure 6J:
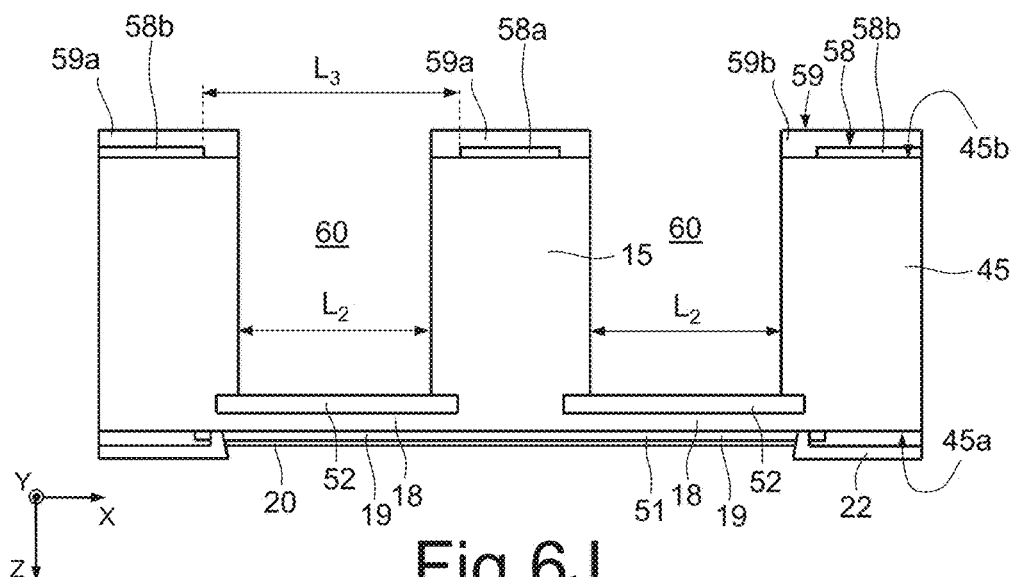

Then, as illustrated in FIG. 6J, the wafer 45 is flipped and, on the rear surface 45b of the wafer 45, oxide regions 58 are formed in a position vertically corresponding to the coupling portion 15' (inner oxide region 58a) and externally with respect to the position assumed by the cantilever elements 18 on the front surface 45a (outer oxide region 58b); in particular, the outer and inner oxide regions 58b, 58a are separated along the direction of longitudinal extension of the cantilever elements 18 by the third width L3.

Mask regions 59 are then formed on the oxide regions 58, and in particular an inner mask region 59a that covers the inner oxide region 58a and an outer mask region 59b that covers the outer oxide region 58b; the outer and inner mask regions 59b, 59a are separated along the aforesaid direction of longitudinal extension of the cantilever elements 18 by the second width L2.

Then a first etch of the wafer 45 is carried out, starting from the rear surface 45b, through the mask regions 59, to form deep cavities 60 (having the aforesaid second width L2), which extend vertically in the wafer 45, starting from the aforesaid rear surface 45b until they reach the buried-oxide region 52.

Figure 6K:
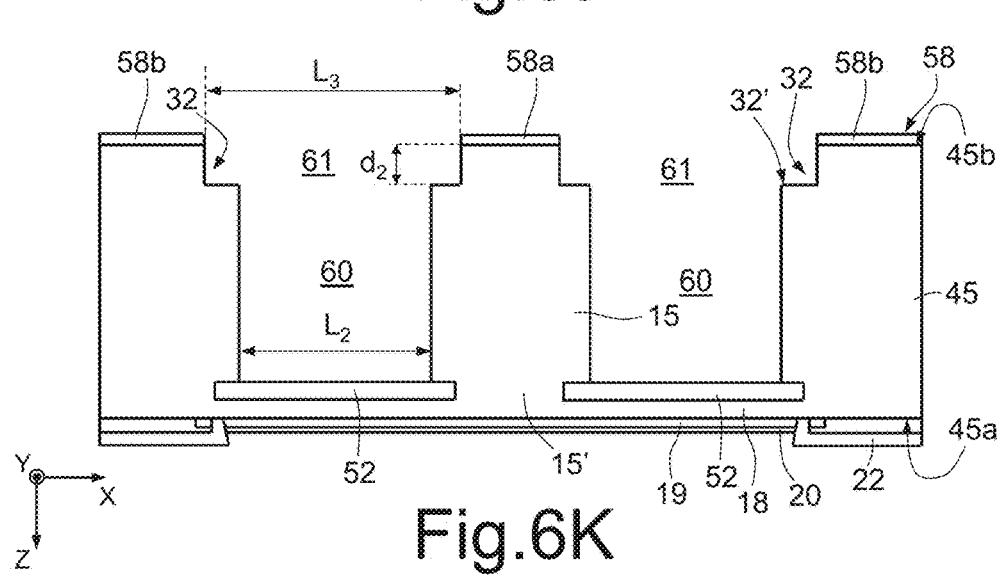

The mask regions 59 are then removed, and a further etch of the wafer 45 is carried out, FIG. 6K, once again starting from the rear surface 45b, this time through the oxide regions 58 to form surface cavities 61 (having the aforesaid third width L3), which extend in a surface portion of the wafer 45 at the aforesaid rear surface 45b.

It should be noted that the aforesaid etching steps carried out in succession hence lead (concurrently, i.e., without any need for further and distinct processing steps) to formation of the second stopper arrangement 32, and in particular of the second stopper surface 32'. It may be noted, in particular, that the geometrical characteristics of the mask regions 59 and of the oxide regions 58 and the characteristics of the etching determine the dimensional characteristics of the aforesaid second stopper arrangement 32 and in particular the extension of the second stopper surface 32' and the distance of the second stopper surface 32' from the rear surface 45b (i.e., the distance d2).

It should be noted that, advantageously, the recess that is defined in the actuator element 15 at the rear surface 45b of the wafer 45 (underneath the inner oxide region 58a of FIG. 6K) limits adhesion of the actuator element 15 to adhesive tape during the subsequent processing steps (any possible mechanical failure of the cantilever elements 18 during detachment of the wafer 45 from the tape during the assembly steps is thus reduced).

Figure 6L:
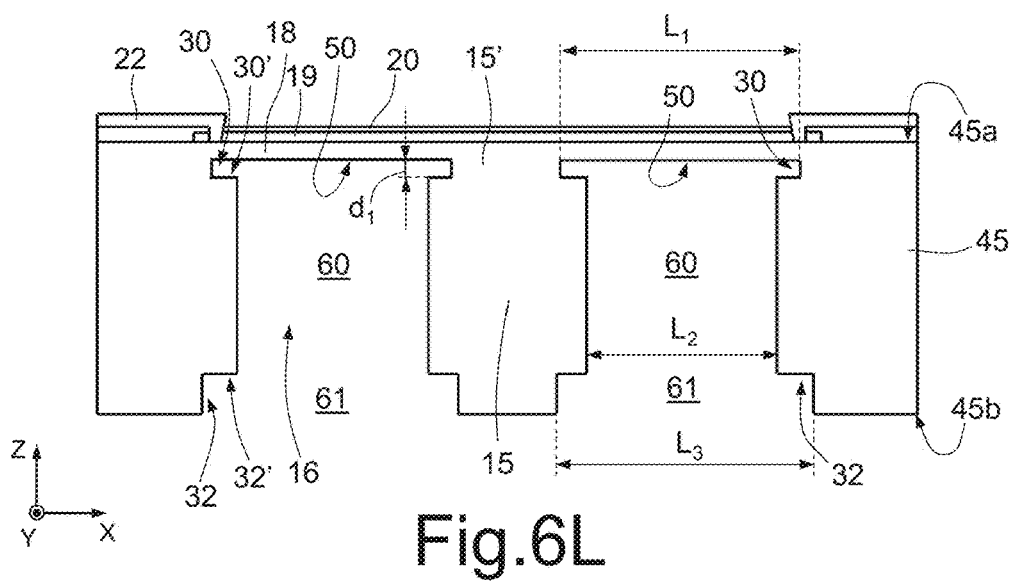

Next, FIG. 6L, after the wafer 45 has once again been flipped, removal of the silicon oxide is carried out by means of wet chemical etching, and in particular removal of the aforesaid oxide regions 58 on the rear surface 45b and also of the buried-oxide region 52 previously obtained inside the buried cavity 50.

In particular, removal of the aforesaid buried-oxide region 52 leads to complete formation of the central opening 16 (which is formed jointly by the aforesaid buried cavity 50, having a width L1, and by the deep and surface cavities 60, 61) and also to release the cantilever elements 18, which are suspended above the same central opening 16.

The removal of the buried oxide also leads (concurrently, i.e., without any need for further and distinct processing steps) to definition of the first stopper arrangement 30, and in particular of the first stopper surface 30' facing the cantilever elements 18.

It should be noted that the geometrical characteristics of the mask regions 59 (illustrated in the aforesaid FIG. 6J) and the geometrical characteristics of the buried cavity 50 determine in this case the dimensional characteristics of the aforesaid first stopper arrangement 30 and in particular the extension of the first stopper surface 30' and the distance d1 of the first stopper surface 30' from the cantilever elements 18.

The process then end (in a way not illustrated) with dicing of the wafer 45 for definition of a plurality of dies 12, each comprising, in the same monolithic body 13, the frame 14, the actuator element 15, and the aforesaid cantilever elements 18, interposed between the frame 14 and the actuator element 15.

The advantages of the present solution are clear from the foregoing description.

In any case, it is underlined that the actuation structure 10 of the MEMS electroacoustic transducer 11 includes bi-directional stopper elements, i.e., acting in both directions of the vertical axis z, enabling, in the case of impact or dropping, effective limitation of damage both to the acoustic membrane 35 and to the cantilever elements 18 and the overlying piezoelectric regions 19.

Advantageously, the first and the second stopper arrangements 30, 32 are integrated and defined in the die 12, in which the actuation structure 10 is obtained, without couplings with external structures being required; simple manufacturing and reduced dimensions are thus achieved. In particular, the dimensional characteristics of the stopper arrangements 30, 32 are a direct consequence of the manufacturing process for producing the actuation structure 10, being thus easy to vary the extension of the facing surface and the facing distance, in particular between the first stopper surface 30' and the facing cantilever elements 18, and between the second stopper surface 32' and the facing rigid lamina 34 (as highlighted schematically by the dashed rectangles and by the arrows in FIG. 2).

The same manufacturing process is simple and economically advantageous and additional and dedicated steps are substantially not required for providing the stopper arrangements 30, 32.

Moreover, the cantilever elements 18, being made of monocrystalline silicon, are stress-free.

The structure and the process described guarantee a considerable freedom of design in the manufacturing of the cantilever elements 18, in particular with the aim of obtaining a structure that, by maximizing displacement of the actuator element 15 connected to the acoustic membrane 35, maximizes the sound power level thereof (dB SPL) as compared to known solutions.

The MEMS electroacoustic transducer 11 is advantageously protected from contamination, in effect being resistant to liquids (waterproof) and dust (dustproof), being developed with piezoelectric technology.

Finally, it is clear that modifications and variations may be made to what has been described and illustrated herein, without thereby departing from the scope of the present disclosure, as defined in the annexed claims.

In particular, it is underlined that alternatives may be envisaged as regards the number and shape of the cantilever elements 18 and, also, as regards the corresponding coupling to the actuator element 15, in particular with the aim of obtaining structures with higher levels of performance in terms of sound power delivered with greater linearity of the frequency response.

Figure 7A:
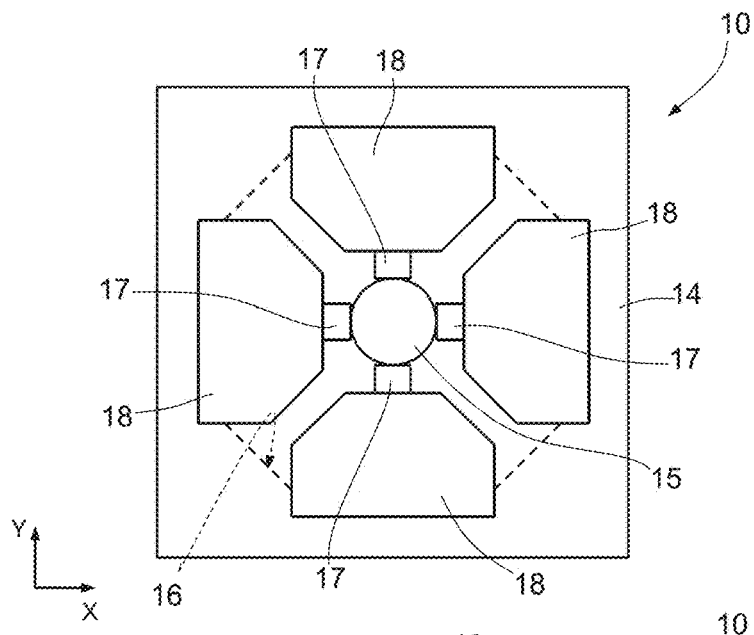
FIGS. 7A-7D are schematic top plan views of possible alternative embodiments of the piezoelectric actuation structure of FIG. 2.
Figure 7B:
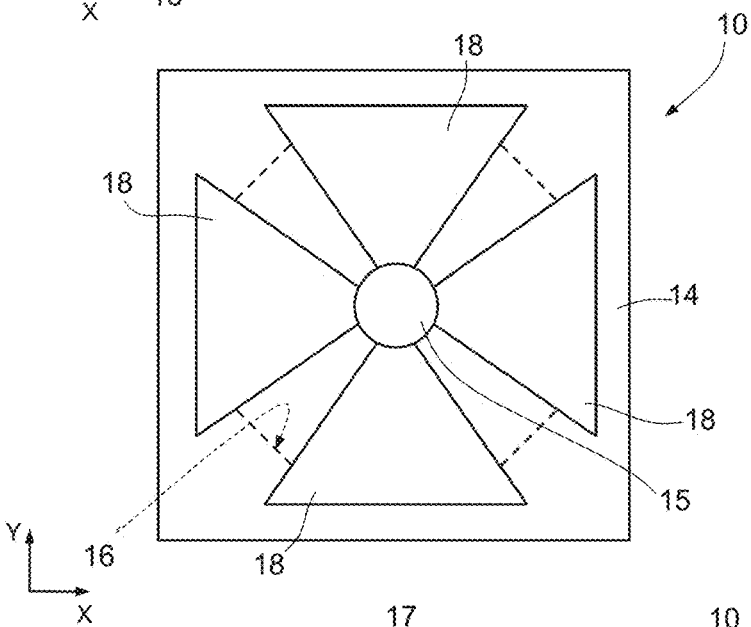
Figure 7C:
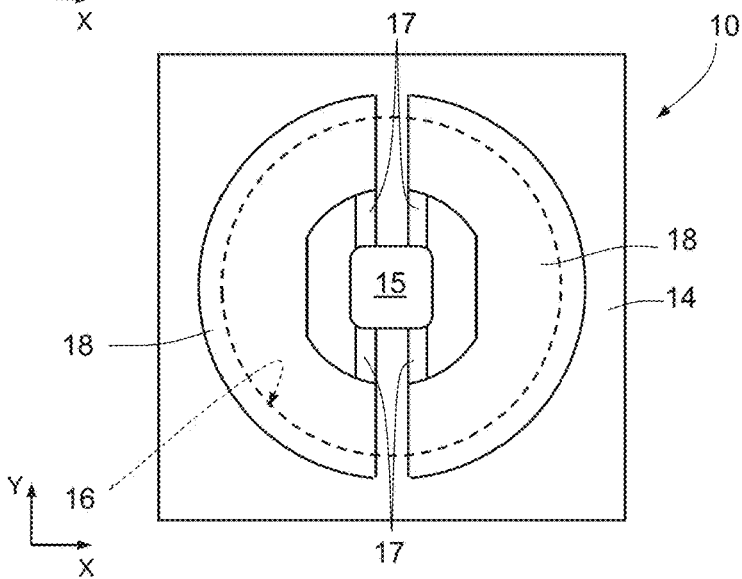
Figure 7D:
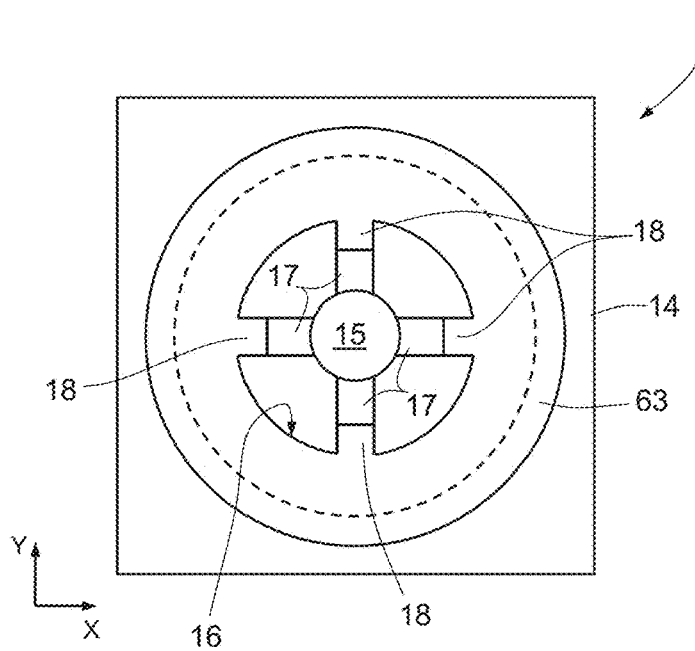

In this regard, FIGS. 7A-7D are schematic illustrations of possible alternative embodiments, in which in particular: the cantilever elements 18 are once again four in number and are elastically coupled to the actuator element 15 by means of respective elastic coupling elements or coupling springs 17, having, however, in this case a generically trapezoidal shape (FIG. 7A); the cantilever elements 18 are once again four in number and have a generically triangular shape, being connected directly and integrally to the coupling element 15, i.e., without the presence of elastic coupling elements (FIG. 7B)—also in this case, the elastic elements could in any case be present; the cantilever elements 18 are two in number, are elastically coupled to the actuator element 15 by means of respective elastic coupling elements 17 and have a generically circular half-ring shape (FIG. 7C); the cantilever elements 18 are four in number, are elastically coupled to the actuator element 15 by means of respective elastic coupling elements 17, have a generically rectangular shape, and are carried by a same external structure 63 with a circular-ring conformation (FIG. 7D).

It is in any case emphasized that further alternatives may be envisaged, also as regards the shape of the die 12 and the geometry in plan view of the central opening 16 (which, as mentioned previously, may be generically polygonal, instead of circular).

Moreover, the piezoelectric regions 19 may extend also above the actuator element 15, or else be removed from the front surface 13a of the monolithic body 13 at the same actuator element 15.

The piezoelectric regions 19 may also be of a bi-morphic type, i.e., including a double layer of piezoelectric material, each layer being interposed between two electrodes.

In a way not shown, the MEMS electroacoustic transducer 11 may further comprise an ASIC (Application-Specific Integrated Circuit), coupled to the actuation structure 10, for example to provide electrical biasing signals. This ASIC electronic circuit can be integrated in the same die 12 where the actuation structure 10 is made, or may be obtained in a distinct die of semiconductor material, which can be housed in the same package as that of the aforesaid die 12.

Moreover, variants of the manufacturing process may be envisaged, in particular, as regards formation of the actuation structure 10.

In this regard, an alternative manufacturing process may envisage different initial steps for providing the buried-oxide region 52 underneath the front surface 45a of the wafer 45.

Figure 8A:
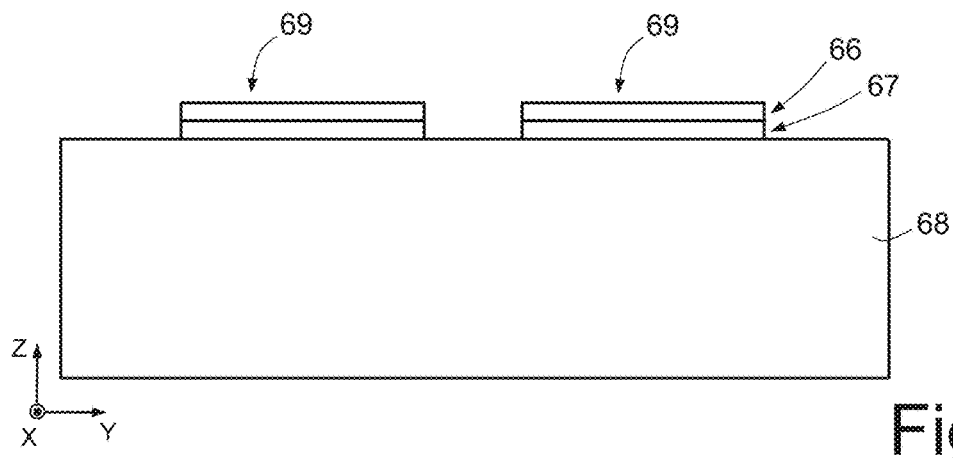
FIGS. 8A-8B are schematic cross-section views of the piezoelectric actuation structure of FIG. 2, in initial steps of a corresponding manufacturing process according to a possible alternative embodiment.

In particular, with reference firstly to FIG. 8A, the process may in this case envisage providing a SOI (Silicon-On-Insulator) wafer, once again designated by 45, having an active layer 66, for example made of monocrystalline silicon, an insulating layer 67, for example made of silicon oxide, and a supporting layer 68, for example once again made of monocrystalline silicon.

In this case, in an initial step of the process, the active layer 66 (after being possibly subjected to a surface thinning-out process) and the insulating layer 67 are subjected to etching so as to define a stacked region 69 of portions of the same active layer 66 and of the insulating layer 67, having an extension corresponding to what will become the central opening 16 and having, at the center, an opening corresponding to what will become the arrangement of the coupling portion 15' of the actuator element 15.

Figure 8B:
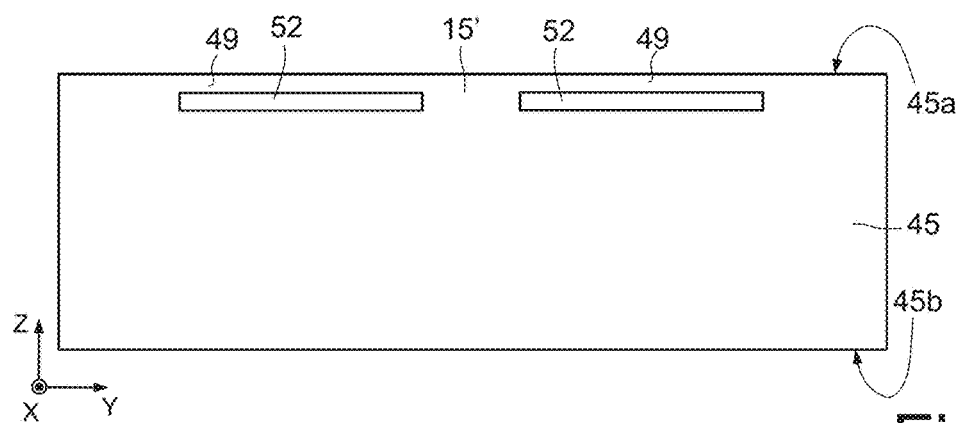

Next, FIG. 8B, the front surface of the wafer is subjected to re-growth of silicon and planarization so as to cause formation, starting from the aforesaid stacked region 69, of the buried-oxide region 52, the membrane 49, over the buried-oxide region 52, and the aforesaid coupling portion 15' of the actuator element 15. It should be noted that, after re-growth, a monolithic body of monocrystalline silicon is hence formed, in a way altogether similar to what has been described previously.

The manufacturing process may then proceed in a way altogether similar to what has been discussed previously (in particular, starting from FIG. 6F).

Finally, it is pointed out that the MEMS electroacoustic transducer 11 may act so as to detect sound waves; i.e., it may provide a MEMS microphone sensor (instead of a MEMS speaker, which has been described previously).

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS structure, comprising:
a die of semiconductor material having a monolithic body with a first surface and a second surface opposite to one another, the first surface extending in a first plane, the die including a frame having a central opening and an actuator element arranged in the central opening of the frame;
cantilever elements coupled over the first surface between the actuator element and the frame;
piezoelectric layers arranged on the cantilever elements and configured to be biased to cause deformation of the cantilever elements by a piezoelectric effect; and
a first stopper element, integrated in the die and configured to interact with the cantilever elements to limit a movement thereof in a first direction along a first axis orthogonal to the first plane towards the central opening.

2. The structure according to claim 1, wherein the frame has a wall that faces the central opening and extends along the first axis, and
wherein the first stopper element includes first recesses of the wall of the frame adjacent to the first surface, the first recesses facing the cantilever elements, and
wherein the first stopper element is arranged at a first distance with respect to the cantilever elements, when the cantilever elements are in a resting condition in the absence of deformation of the cantilever elements by a piezoelectric effect.

3. The structure according to claim 2, wherein the actuator element has a respective wall, which faces the central opening and extends along the first axis, and the first stopper element includes respective first recesses of the wall of the actuator element adjacent to the first surface, which determine a respective stopper surface facing the cantilever elements.

4. The structure according to claim 1, further comprising a second stopper element integrated in the die and configured to limit a movement of the cantilever elements in a second direction along a second axis, the second direction moving away from the central opening; and the first and the second stopper elements jointly defining a bi-directional stopper mechanism along the first axis.

5. The structure according to claim 4, wherein the frame has a wall that faces the central opening and extends along the second axis, and the second stopper element includes second recesses of the wall of the frame adjacent to the second surface, which form at least partially a second stopper surface, arranged at a second distance with respect to the second surface.

6. The structure according to claim 5, wherein the actuator element has a respective wall that faces the central opening and extends along the first axis, and the second stopper element includes respective second recesses of the wall of the actuator element adjacent to the second surface, which form at least partially the second stopper surface.

7. The structure according to claim 1, wherein the central opening includes:
a first cavity adjacent to the first surface underlying the cantilever elements and having a first width in a longitudinal direction of extension of the cantilever elements along a second axis of the first plane;
a second cavity underlying the first cavity and having a second width in the longitudinal direction; and
a third cavity adjacent to the second surface, underlying the second cavity and having a third width in the longitudinal direction, the first width and the third width are each greater than the second width.

8. The structure according to claim 1, wherein the cantilever elements have a first end coupled to the frame and a second end elastically coupled to a coupling portion of the actuator element through respective elastic coupling elements.

9. The structure according to claim 1, wherein the cantilever elements are made of monocrystalline silicon.

10. A MEMS electroacoustic transducer, comprising:
an actuation structure, the actuation structure including:

a die of semiconductor material having a monolithic body with a first surface and a second surface opposite to one another, the first surface extending in a first plane, the die including a frame having a central opening and an actuator element arranged in the central opening of the frame;

cantilever elements coupled over the first surface between the actuator element and the frame;

piezoelectric layers arranged on the cantilever elements and configured to be biased to cause deformation of the cantilever elements by a piezoelectric effect;

a first stopper element, integrated in the die and configured to interact with the cantilever elements to limit a movement thereof in a first direction along a first axis orthogonal to the first plane towards the central opening; and an acoustic membrane centrally coupled to the actuator element, wherein deformation of the cantilever elements by the piezoelectric effect is configured to displace the actuator element and the acoustic membrane.

11. The transducer according to claim 10, further comprising a rigid stopper element interposed between the acoustic membrane and the actuator element adjacent to the second surface.

12. The transducer according to claim 10, further comprising supporting element coupled to the frame at the second surface of the monolithic body, wherein the acoustic membrane has end portions coupled to the supporting elements.

13. The transducer according to claim 10, further comprising a housing structure, the housing structure having:
 a base, to which the actuation structure is coupled adjacent to the first surface; and
 a supporting portion, which surrounds the die and has a first surface coupled to the base and a second surface, opposite to the first surface in the first axis, to which the acoustic membrane is coupled.

14. The transducer according to claim 10, included in a speaker for generation of sound waves in an audio band.

* * * * *